US008618731B2

(12) United States Patent
Albrecht et al.

(10) Patent No.: US 8,618,731 B2
(45) Date of Patent: Dec. 31, 2013

(54) LARGE-AREA FLEXIBLE OLED LIGHT SOURCE

(75) Inventors: Andrew S. Albrecht, Shaker Heights, OH (US); James Michael Kostka, Mayfield Heights, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 12/782,228

(22) Filed: May 18, 2010

(65) Prior Publication Data

US 2011/0285273 A1    Nov. 24, 2011

(51) Int. Cl.
*H01J 1/62*   (2006.01)
*H01J 63/04*   (2006.01)

(52) U.S. Cl.
USPC .......................... 313/512; 313/504; 313/506

(58) Field of Classification Search
USPC .......................................... 313/504, 506, 512
See application file for complete search history.

(56) References Cited

U.S. PATENT DOCUMENTS

| | | | | |
|---|---|---|---|---|
| 6,204,453 B1 * | 3/2001 | Fallon et al. | | 174/255 |
| 6,451,509 B2 * | 9/2002 | Keesler et al. | | 430/311 |
| 6,515,417 B1 * | 2/2003 | Duggal et al. | | 313/506 |
| 6,911,666 B2 * | 6/2005 | Voutsas | | 257/40 |
| 7,005,799 B2 * | 2/2006 | Booth et al. | | 313/512 |
| 7,018,713 B2 * | 3/2006 | Padiyath et al. | | 428/411.1 |
| 7,026,759 B2 * | 4/2006 | Mishima | | 313/512 |
| 7,108,392 B2 * | 9/2006 | Strip et al. | | 362/145 |
| 7,312,103 B1 * | 12/2007 | Huemoeller et al. | | 438/106 |
| 7,679,283 B2 * | 3/2010 | Nimura | | 313/506 |
| 7,692,381 B2 * | 4/2010 | Kwon et al. | | 313/506 |
| 7,973,473 B2 * | 7/2011 | DeCook et al. | | 313/512 |
| 2003/0178937 A1 | 9/2003 | Mishima | | |
| 2004/0021425 A1 * | 2/2004 | Foust et al. | | 315/169.3 |
| 2005/0224935 A1 * | 10/2005 | Schaepkens et al. | | 257/678 |
| 2005/0248935 A1 | 11/2005 | Strip | | |
| 2006/0066229 A1 * | 3/2006 | Nimura | | 313/506 |
| 2006/0102900 A1 * | 5/2006 | Shin et al. | | 257/59 |
| 2006/0125383 A1 * | 6/2006 | Liu et al. | | 313/504 |
| 2006/0132032 A1 * | 6/2006 | Schaepkens et al. | | 313/512 |
| 2006/0181669 A1 * | 8/2006 | Schaepkens et al. | | 349/158 |
| 2006/0208634 A1 * | 9/2006 | Schaepkens et al. | | 313/506 |
| 2006/0216410 A1 * | 9/2006 | Schaepkens et al. | | 427/66 |

(Continued)

FOREIGN PATENT DOCUMENTS

EP    1120838 A2   8/2001
WO    03/052825 A1   6/2003

OTHER PUBLICATIONS

PCT Search Report issued in connection with corresponding WO Patent Application No. U.S. Appl. No. 11/36570 filed May 16, 2011.

*Primary Examiner* — Nimeshkumar Patel
*Assistant Examiner* — Thomas A Hollweg
(74) *Attorney, Agent, or Firm* — Fay Sharpe LLP

(57) ABSTRACT

A light emitting assembly includes a backplane having a first surface area and an impermeable layer. At least first and second light emitting devices are received on the first surface of the backplane, each light emitting device having a surface area less than the first surface area and electrically connected to an associated external driver. The first and second light emitting devices are positioned on the backplane in contiguous relation without a hermetic edge seal therebetween to maximize the filling factor, and an encapsulating material is received over and seals the first and second light emitting devices.

22 Claims, 4 Drawing Sheets

(56) References Cited

U.S. PATENT DOCUMENTS

| | | |
|---|---|---|
| 2007/0188087 A1* | 8/2007 | Kwon et al. .................. 313/506 |
| 2007/0200489 A1* | 8/2007 | Poon et al. .................... 313/502 |
| 2007/0222370 A1* | 9/2007 | Zhu et al. ...................... 313/504 |
| 2009/0001886 A1* | 1/2009 | Ibe et al. ....................... 313/512 |
| 2009/0284158 A1* | 11/2009 | Parthasarathy et al. .... 315/169.3 |
| 2010/0187979 A1* | 7/2010 | Shim et al. .................... 313/504 |

\* cited by examiner

LARGE-AREA FLEXIBLE OLED LIGHT SOURCE

BACKGROUND OF THE DISCLOSURE

This disclosure relates to a method of forming and the resultant design of a large area flexible light source. More particularly, the disclosure relates to the method and design of a flexible OLED light source where small area flexible OLEDs are manufactured and integrated into a large panel.

Currently, manufacturing capabilities and material property limits constrain the size of the individual organic light emitting diode (OLED) devices to a relatively small dimension. By relatively small dimension is meant an area on the order of millimeters squared or centimeters squared, i.e, less than 100 cm$^2$ when contrasted with a large area lighting panel greater than this and on the order of feet square meter squared. Therefore, in order to obtain a large area lighting panels, individual OLEDs need to be tiled together to form the larger product.

Another issue is that current OLED materials are sensitive to oxygen and moisture. As a result, individually encapsulated OLED devices require an edge seal of some nominal width, that is, the perimeters of individual OLED devices are hermetically sealed. When positioned or tiled together in a group to form the desired large-area lighting panels, each of the individual edge seals has an adverse impact on the total illuminated area of the panel. This is generally referred to as "fill factor" or "filling factor" where the entire area of the large area lighting panel is not light emitting, and therefore the filling factor is measured as the proportion of the surface area that is illuminated or emits light relative to the total surface area of the panel.

In prior arrangements, designers generally appear to focus on total light output of the array of individual OLED devices that are joined together, and therefore ignore or do not emphasize the non-light emitting portions of the assembly. For example, when designing large area OLED panels, a typical approach is to assemble multiple glass-substrate OLED devices that are individually hermetically sealed about each of their perimeters, and arrange the sealed OLED devices in tiled fashion on a rigid frame. This approach overlooks at least two important criteria. First, this design approach fails to minimize the non-light emitting portions of the assembly that result from the sealing material that encapsulates the individual OLED devices in the large area panel and, second, ignores the goal of flexibility (where flexibility is generally defined as the ability to conform or bend the panel, without damage, to a radius of curvature on the order of about five centimeters).

Accordingly, a need exists for a large area OLED light source, and method of forming same, and one that maximizes the fill factor and more desirably provides for a flexible panel.

SUMMARY OF THE DISCLOSURE

A light emitting assembly includes a backplane having a first surface area and an impermeable layer. At least first and second light emitting devices are received on the first surface of the backplane, each light emitting device having a surface area less than the first surface area and electrically connected to an associated external driver. The first and second light emitting devices are positioned on the backplane in contiguous relation without a hermetic edge seal therebetween, and an encapsulating material is received over and sealing the first and second light emitting devices. The hermetic edge seal is defined as the seal that joins the two outer-most impermeable substrates of the panel, e.g. glass, backplane, or transparent ultra high barrier film. In some instances, another seal may be provided on the individual devices prior to tiling and final encapsulation. This OLED device seal is often implemented to help protect the OLED device from mechanical damage, and partially contribute to the overall barrier properties of the OLED panel.

The exemplary embodiment includes first and second OLEDs as the light emitting devices.

Preferably the backplane is flexible in one embodiment.

The backplane includes an impermeable metal foil with an insulator applied to one face, the insulator adhesively securing the light emitting devices thereon.

The backplane is impermeable to oxygen and water vapor, and may be insulated on only the first surface, or on both first and second surfaces. A transparent ultrahigh barrier film is then laminated on top of the light emitting devices, creating a hermetic package.

In one arrangement, conductive traces are applied on the insulator before the OLEDs are placed on the insulator and electrically connected to the traces.

In another arrangement, openings are formed in the backplane and metal patches laminated over the insulator and the OLEDs electrically connected to the patches. A transparent ultra high barrier film is then laminated on top of the OLEDs to create the hermetically sealed package.

The light emitting devices may be connected in series, parallel, independently, or to a single common bus.

A primary benefit is the provision of a large area light emitting assembly where the fill factor is significantly improved.

Another benefit is that the large area light assembly is flexible.

Still another benefit is associated with providing a conductive network for electrically connecting the light emitting devices and use of an encapsulation layer to protect the entire panel from oxygen and moisture.

Still other benefits and advantages of the present disclosure will become more apparent from reading and understanding the following detailed description.

DETAILED DESCRIPTION OF THE PREFERRED EMBODIMENTS

Figure 1:
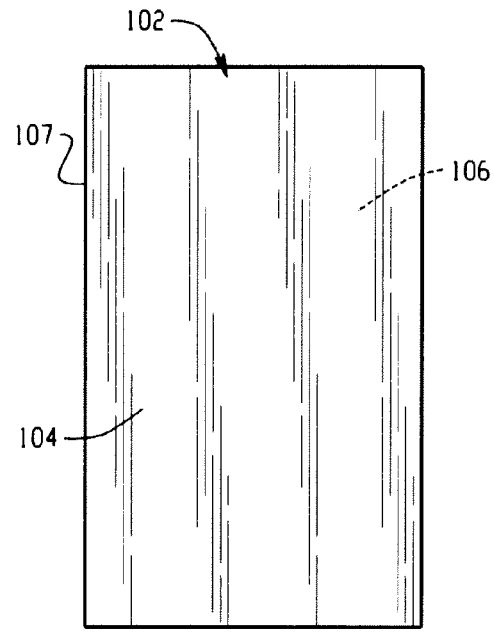
FIG. 1 is a plan view of the metal foil included in the backplane.

Turning to a first exemplary embodiment shown in FIGS. 1-4, a large area light source 100 is shown in different stages of assembly. Particularly, metal foil 102 forms a portion of a backplane. Although the metal foil 102 is shown as having a generally rectangular conformation, other configurations can be used without departing from the scope and intent of the present disclosure. The metal foil 102 is thin, for example having a thickness on the order of approximately 25 micrometers, although again such a thickness is deemed to be exemplary only, and the metal foil provides for desired qualities of being conductive, flexible, and impermeable to oxygen and moisture. In the preferred embodiment, the metal foil is substantially homogeneous over the entire extent, i.e., the thin metal foil generally has the same material characteristics and dimensions over a first or front surface 104, a second or rear surface 106 (not shown), and from the perimeter 107 inward.

Figure 2:
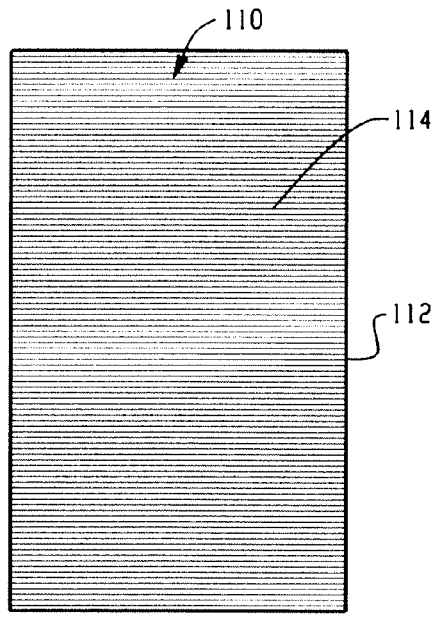
FIG. 2 is a plan view of the backplane after an insulator and/or adhesive is applied to a first or front surface, and possibly a second or back surface of the metal foil.

In FIG. 2, a first surface 104 of the metal foil is shown with an insulator 110 applied to it. Preferably, the insulator 110 is a thin polymer or plastic material that coats the entire first surface of the thin metal foil including a perimeter or edge 112 which covers the edge 107 of the metal foil. Although in some instances the second surface 106 (not shown) of the metal foil is not provided with an insulator, it will be understood that in other applications it is desirable to apply the insulator to the second surface 106 and/or completely encapsulate the metal foil including the first and second surfaces and perimeter. Again, and by way of example only, the insulator may be on the order of approximately 25 micrometers thick and covers the entire surface of the metal foil. In addition, an adhesive may be and oftentimes is desirably applied to the front and/or back surfaces 104, 106 of the metal foil. The adhesive in the exemplary embodiment may be the same material that is used as the insulator or may be a separate layer such as an epoxy based adhesive, melt thermoplastic adhesive, or pressure sensitive adhesive, although any material suitable for the purposes described below may be used. The adhesive is represented by reference numeral 114 although it is not illustrated as a separate structural layer in FIG. 2 since the insulator may serve both purposes of covering the impermeable metal foil and adhesively securing the OLEDs to the backplane. It is preferable that the insulator materials have a low permeability to oxygen and moisture, as to prevent ingress through the edge seal and subsequent defect formation within the OLED devices.

Figure 3:
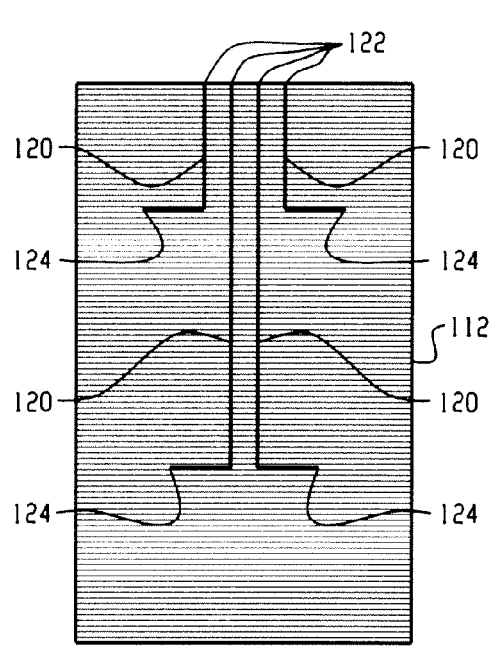
FIG. 3 shows thin conductive traces applied to the backplane.
Figure 4:
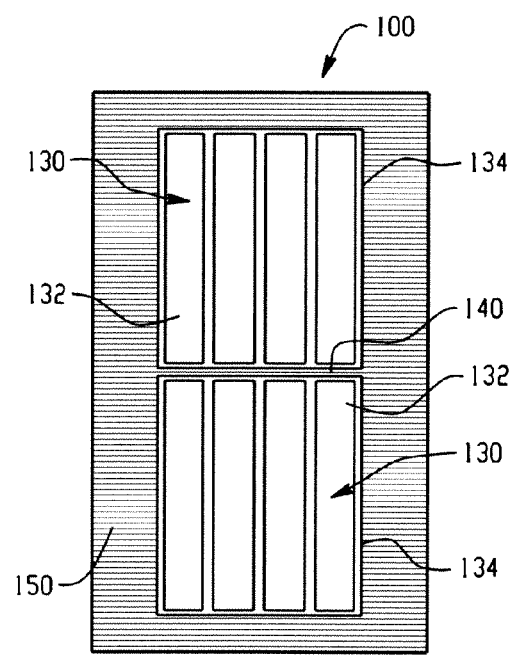
FIG. 4 shows positioning of OLED devices without individual hermetic edge seals in contiguous relation over the first surface of the backplane.
Figure 5:
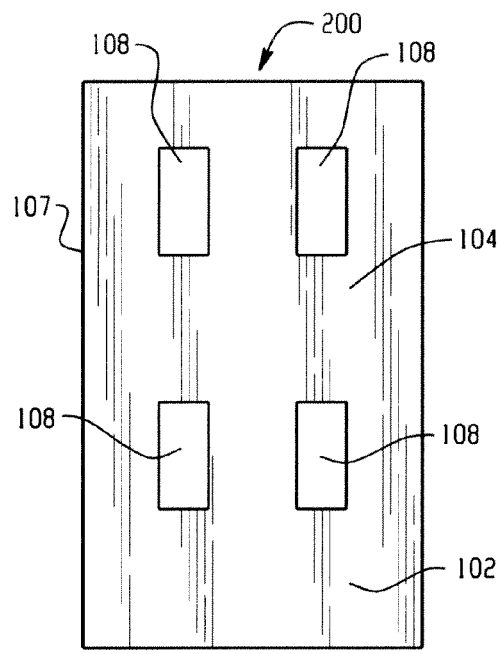
FIG. 5 is a plan view showing openings formed in the metal foil of the backplane.
Figure 6:
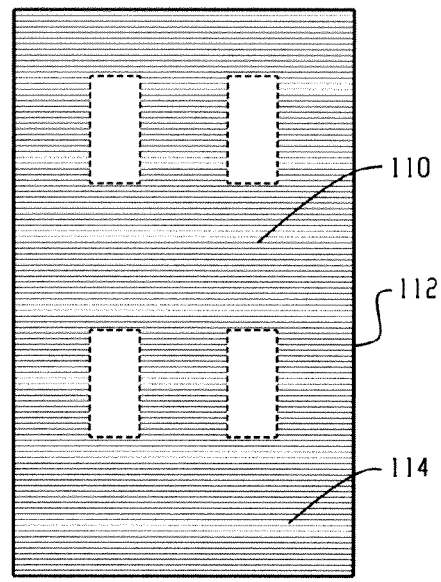
FIG. 6 is a plan view of an insulator and/or adhesive applied to front and rear surfaces of the metal foil portion of the backplane of FIG. 5.

FIG. 3 illustrates the application of thin conductive traces 120 applied to the backplane and particularly on the insulator 110 that covers the first surface 104 of the thin metal foil. The traces 120 may vary in number, although it is typical to provide first and second traces for each OLED device that is mounted on the backsheet. Any convenient manner of applying the conductive traces 120 may be used such as screen printing, vapor deposition, etc. The traces 120 are thin and approximately one micron thick. As best exemplified in FIG. 3, the traces extend inwardly from first ends 122 along the edge 112 of the insulator or backplane for establishing electrical contact with an edge connector (not shown), and terminate at second ends 124 situated at predetermined locations on the surface of backplane for connection with electrodes associated with each light emitting device, or OLED 130, as shown in FIG. 4. In an exemplary embodiment, each OLED device 130 ranges in size from approximately 5 cm$^2$-100 cm$^2$, and preferably is not hermetically sealed along its edge or perimeter. In this manner, substantially all of the outwardly facing first or outer surface 132 of each OLED device 130 is light emitting. Moreover, since no hermetic edge seal is provided for each of the individual OLED devices, perimeter edges 134 of each OLED device can be brought into closer relation, i.e., more closely spaced relative to an edge of an adjacent OLED. This close spacing of contiguous OLEDs advantageously minimizes an interstitial space or gap 140 between the two OLED devices 130 illustrated in FIG. 4. This interstitial gap 140 may be as small as possible, for example, on the order of 1 mm, although minimizing the spacing and increasing the fill factor are the general goals so that the actual dimensional value may vary from one application to another.

Subsequently, once the desired number of OLED devices is mounted onto the backplane comprised of the metal foil, insulator, adhesive, conductive traces, etc., a perimeter or edge seal 150 is then provided about the perimeter of the assembled or mounted OLEDs on the backplane. In some instances, the edge seal may extend over the outer perimeter and onto the second or rear surface of the backplane. The hermetic edge seal provides the desired protection from oxygen and moisture, and has a relative nominal thickness or width on the order of approximately 10 mm. This relatively wide width is due to the fact that polymeric adhesives used to encapsulate flexible OLEDs are inherently porous, which allows oxygen and water vapor to slowly diffuse through the bulk of the material. By having a long permeation path length, such as 10 mm, it is possible to significantly prolong the time it takes water and oxygen to diffuse through the material and react with the OLED device, thus providing a hermetic seal and giving the product an acceptable shelf life. In this manner, individual unencapsulated OLEDs 130 are tiled together, i.e, adhesively secured to the backplane, before the hermetic seal is applied over the assembly. The filling factor of the light emitting panel 100 is thereby significantly improved. That is, since each individual OLED does not include an encapsulated edge seal, that width of the edge seal is eliminated from each OLED device and permits contiguous OLED devices to be brought closer together and thereby minimizes the dimension of the interstitial gap 140. Again, the filling factor is maximized, i.e., a proportion of the illuminated area relative to the total surface area of the panel. Increasing the amount of the total surface area of the OLED panel that emits light means a significant improvement in overall light or lumens from the panel. Improvements in fill factor can vary drastically depending on the size of the individual OLED devices, the number of devices tiled in the panel, and the required width of the hermetic edge seal. As an example, if nine 5 cm×5 cm devices are tiled into a large square panel, assuming a 1 cm hermetic edge seal and a 1 mm interstitial gap for unencapsulated OLEDs, the fill factor can be improved from 51% to 76% by tiling the unencapsulated OLEDs prior to encapsulation.

A second embodiment is shown in FIGS. 5-11. Since many features are similar, like reference numerals will refer to like elements and new components are identified by new reference numerals. For example, the large area light assembly is referenced as 200. Again, the backplane includes a thin metal foil 102 having a first or upper surface 104 and a second or lower surface 106 (not shown) and a perimeter or edge 107, and therefore reference is made to FIG. 1 since the metal foil is substantially unchanged. Openings or holes 108 are formed in the metal foil (FIG. 5) such as being cut or punched through the metal foil at select interior regions. These openings 108 are intended to pass through the entire thickness of the metal foil 102 and are positioned at preselected locations for electrical connection with the OLEDs that are tiled on the backplane as will become more apparent below. For purposes of illustration, four such openings 108 are formed in the otherwise impermeable metal foil and each opening has substantially the same dimension, although this disclosure should not be limited to arrangements where the openings are all identical.

An insulator 110 is applied to the front 104 and rear 106 surfaces of the metal foil 102, again in much the same manner as shown and described with respect to FIG. 2. In addition, it is intended that the insulator 110 will also cover the openings 108 previously formed in the metal foil. An adhesive 114 is also preferably applied to at least the first surface for subsequently securing the OLED devices.

Figure 7:
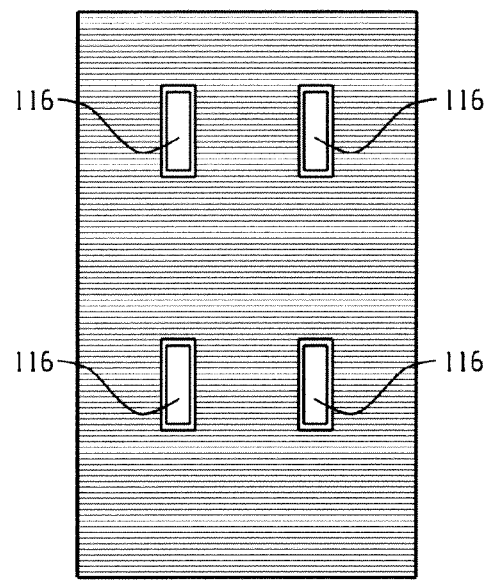
FIG. 7 is a plan view illustrating formation of openings in the insulator substantially aligned with the openings through the metal foil.

As shown in FIG. 7, smaller openings or holes 116 are cut through the insulator 110 and centered relative to the openings 108 through the metal foil, and preferably slightly smaller than the openings 108 formed through the metal foil. In this manner, there is less chance that inadvertent contact with the metal foil will occur since the insulator covers the entire inner perimeter edge of the openings 108. These openings 116 through the insulator may vary in size even though each of the openings in FIG. 7 are shown to be the same size, and importantly allow electrical contact from the first or front surface 104 to the second or rear surface 106 of the backplane.

Figure 8:
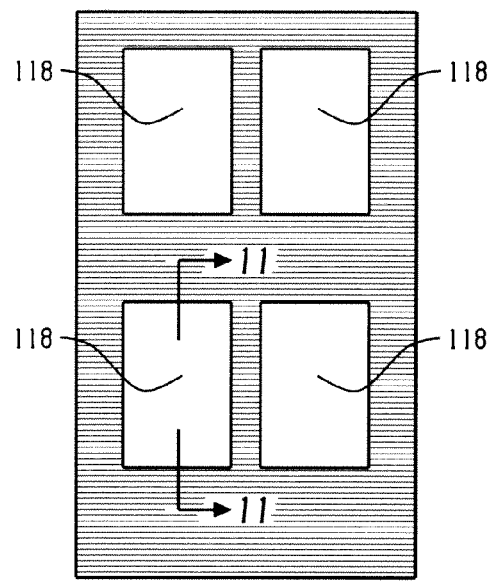
FIG. 8 shows metal patches positioned over the openings formed through the insulator and metal foil backplane.
Figure 9:
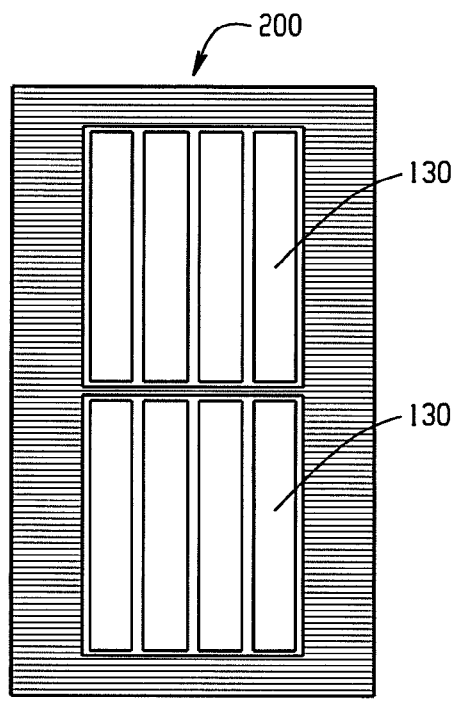
FIG. 9 illustrates positioning of the OLEDs on the backplane.
Figure 10:
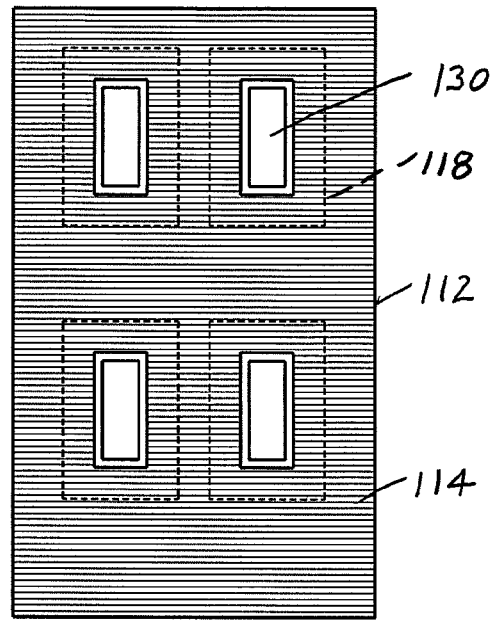
FIG. 10 is a plan view of the rear surface of the backplane.
Figure 11:
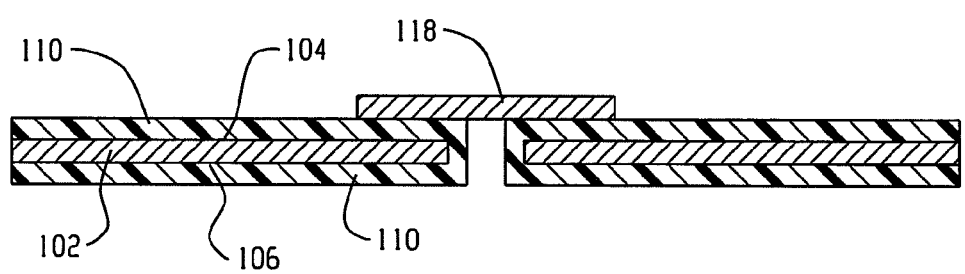
FIG. 11 is an enlarged cross sectional view taken generally along the lines 11-11 of FIG. 8.
Figure 12:
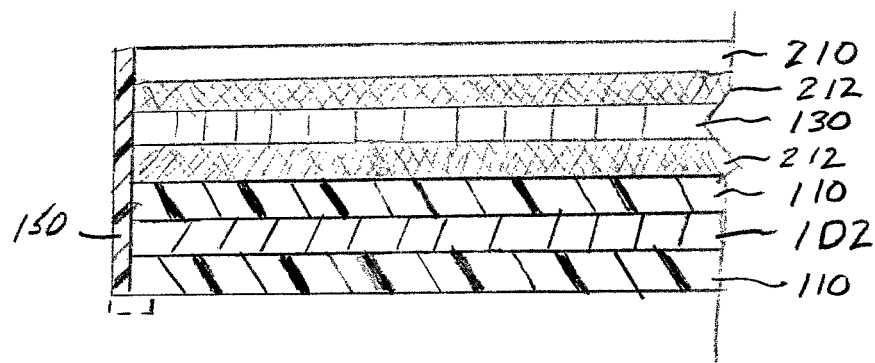
FIG. 12 is an enlarged cross-sectional view of the light source.

In FIG. 8, individual metal patches 118 are dimensioned to overlie the openings 108, 116 in the backplane and are secured to the front face 104 through a lamination process. When individual OLED devices without a hermetic edge seal 130 are secured to the panel via adhesive 114 disposed on the insulator 110 on the front surface 104 of the backplane, the electrodes (not shown) of the OLED devices 130 may be electrically connected to one of the respective electrical patches 118, and an electrical connection of the patches with an associated electronic driver (not shown) is completed. As also shown in FIG. 10, a rear surface of the patch 118 is accessible through openings 116 in the insulator and likewise formed within the openings 108 through the otherwise impermeable metal foil. In this way, the electrical connection can be completed on the rear surface of the backplane and such connections do not interfere with the light emitting surface 132 of the OLEDs. This is further illustrated in FIG. 11 where the opening 116 through the adhesive/insulator 110 provided on both front and rear surfaces of the impermeable metal foil 102 permits connection to the patch 118.

As noted with the embodiment with FIGS. 1-4, the embodiment of FIGS. 5-11 also uses individual OLED devices that do not have a hermetic edge seal. As a result, each OLED can be brought in closer relation with the next adjacent OLED and the dimension of the interstitial gap 140 is thereby minimized between contiguous, tiled OLEDs. Again, this arrangement maximizes the fill factor of the panel so that a greater percentage of the total surface area of the backplane is covered with light emitting surface areas provided by the individual OLED devices that are secured thereto. As a result, light output is maximized. A hermetic edge seal 150 is provided around the entire perimeter region of the large area light assembly 200, providing the desired encapsulation that protects the assembly from the deleterious effects of oxygen or moisture.

Each of these embodiments also uses an ultra high barrier film that is transparent and laminated on top of the OLED devices. This barrier film creates a hermetic package with electrical leads that extend to an edge of the package (as in the embodiment of FIGS. 1-4) or creates a hermetic package without an edge connector (as illustrated in the embodiment of FIG. 5-11).

Adhesively bonding the OLED devices 130 to the backplane 102, 110 and front surface of the UHB film 210 with an adhesive 212 provides distinct advantages over prior arrangements. For example, adhering the OLED device 130 to the ultra high barrier film 210 optically couples the materials, allowing more light to escape. Perhaps more importantly though, adhesively securing the OLED 130 to the UHB 210 and backplane 102, 110 prevents the trapping of gas during the lamination process. Without the adhesive 212, pockets of gas can be trapped during the lamination process, and these gas pockets can move around within the hermetic panel when in flexed applications, which leads to unwanted stresses and potential delamination defects. It is also not aesthetically pleasing to have a gas bubble trapped in the panel. Having adhesive 212 disposed over the entire UHB film 210 (internal to the package) and having adhesive over the entire backsheet 102, 110 (except where electrical contact is made with the OLED 130) is a preferred embodiment. The adhesive 212 could be thermoplastic, thermosetting, PSA, or a combination.

A method and design of a large area flexible OLED light source is provided. The individual small area flexible OLEDs without hermetic edge seals are manufactured and integrated into a larger panel which provides a means of electrically connecting the OLEDs, and hermetically encapsulating the OLEDs while maintaining flexibility of the entire system. In another embodiment, a non-flexible version is also available where the desired property of maximizing the filling factor is desired but flexibility may not be a concern. Due to manufacturing capabilities and material property limits, the size of individual OLED devices are typically constrained to a relatively small dimension. Therefore, in order to obtain the large area lighting panels as described above, the individual OLEDs do not each have a hermetic edge seal and are thereby tiled together to form the larger panel. By eliminating the edge sealing on each individual OLED, the fill factor of the overall panel, i.e., the proportion of illuminating area within the panel is increased, when these devices are assembled into larger panels. The individual OLEDs are tiled together in an unencapsulated form and the hermetic seal is subsequently applied to the overall assembly once all of the individual OLEDs are secured to the surface. The backplane, OLEDs and transparent encapsulation layer provide for a large area panel. The backplane is impermeable, and in this arrangement provides a conductive network for electrically connecting one or more of the OLED devices in the large area panel. These arrangements can maintain flexibility as well. The backplane also includes a means for external connection to an associate electrical driver. Conductive traces are important to optimize, as a hermetic seal must still be made. The use of thin and narrow traces can have significant power losses over long distances. Therefore, a design of variable trace thickness or even just material selection could resolve some of these issues. By using initially unencapsulated OLEDs, there is no hermetic edge seal, thereby allowing for placement for OLEDs with minimal spacing in a corresponding increase in the filling factor of the emissive area. Finally, the encapsulation layer is applied to the entire panel, protecting the panel from oxygen and moisture.

The disclosure has been described with reference to the preferred embodiments. Obviously, modifications and alterations will occur to others upon reading and understanding the preceding detailed description. It is intended that the disclosure be construed as including all such modifications and alterations.

What is claimed is:

1. A light-emitting assembly comprising:
   a backplane having a first surface area and including an electrically conductive portion on at least a first surface thereof;
   at least first and second light-emitting devices received on the first surface of the backplane and configured to each direct light outwardly in a same, first direction, each of the first and second light-emitting devices has a surface area less than the first surface area and electrically connected to the electrically conductive portion of the backplane to form a large area lighting panel on the order of 100 cm$^2$ and greater;
   an encapsulation material extending over and hermetically sealing the at least first and second light-emitting devices without a hermetic edge seal between the first and second light-emitting devices to maximize the filling factor and minimize a gap between adjacent first and second light emitting devices;
   an electrical path for connecting to an associated electrical driver;
   an ultrahigh barrier (UHB) film received over the at least first and second light-emitting devices; and
   the encapsulation material including an adhesive between the UHB film and the light-emitting devices securing the at least first and second light-emitting devices to the UHB film and also between the backplane and the light-emitting devices securing the at least first and second light-emitting devices to the backplane.

2. The assembly of claim 1 wherein the encapsulation material hermetically seals the first and second light-emitting devices.

3. The assembly of claim 1 wherein the first and second light-emitting devices are OLEDs.

4. The assembly of claim 1 wherein the backplane is flexible.

5. The assembly of claim 1 wherein the backplane is non-flexible.

6. The assembly of claim 1 wherein each of the individual at least first and second light-emitting devices do not have an individual hermetic edge seal prior to receipt on the backplane to maximize the filling factor.

7. The assembly of claim 1 wherein the electrical path includes conductive traces formed along a surface of the backplane.

8. The assembly of claim 1 wherein the encapsulating material is light transmissive.

9. The assembly of claim 1 wherein the backplane is impermeable to oxygen and water vapor.

10. The assembly of claim 1 wherein the light emitting devices are connected in one of series, parallel, independently, or to a single common bus.

11. The assembly of claim 1 wherein the backplane includes an impermeable metal foil having a first surface that is covered with an insulator.

12. The assembly of claim 11 wherein the backplane includes aligned openings in the metal foil insulator, and an electrically conductive patch received over the openings, and the at least first and second light emitting devices are electrically connected to the patch.

13. The assembly of claim 11 wherein the insulator encapsulates the impermeable metal foil.

14. The assembly of claim 11 wherein the electrically conductive portions are traces on the insulation layer.

15. The assembly of claim 1 wherein the adhesive is disposed over the entire UHB film and the entire backplane.

16. The assembly of claim 1 wherein the adhesive is one of a thermoplastic, thermoset, PSA, or a combination thereof.

17. A light assembly comprising:
    a backplane having a first surface that includes a conductive portion thereon;
    first and second OLEDs positioned on the backplane in contiguous relation without a hermetic edge seal between the OLEDs to maximize the filling factor and minimize a gap between adjacent OLEDs to form a large area lighting panel on the order of 100 cm2 and greater;
    an encapsulating material over the first and second OLEDs and the backplane first surface;
    an ultrahigh ultrahigh barrier (UHB) film received over the first and second OLEDs; and
    the encapsulating material including adhesive securing the first and second OLEDs to the UHB film and also securing the first and second OLEDs to the backplane.

18. The light assembly of claim 17 wherein the backplane is flexible.

19. The light assembly of claim 17 wherein the backplane is non-flexible.

20. The light assembly of claim 17 wherein the adhesive is one of a thermoplastic, thermoset, PSA, or a combination thereof.

21. A method of forming an OLED light source comprising:
    providing a backplane and an ultrahigh barrier (UHB) film;
    assembling individual OLEDs on the backplane in contiguous relation and beneath the UHB film to form a large area lighting panel on the order of 100 cm$^2$ and greater;
    adhesively securing the OLEDs to the backplane and the UHB film; and
    hermetically sealing the OLEDs on the backplane without a hermetic edge seal between the OLEDs to maximize the filling factor and minimize a gap between adjacent OLEDs.

22. The method of claim 21 further comprising electrically connecting the OLEDs to conductive portions on the backplane before the sealing step.

* * * * *